(12) United States Patent
Miller et al.

(10) Patent No.: US 11,619,770 B2
(45) Date of Patent: *Apr. 4, 2023

(54) ZONED OPTICAL WAVEPLATE

(71) Applicant: Lumentum Operations LLC, Milpitas, CA (US)

(72) Inventors: John Michael Miller, Gatineau (CA); Joel Milgram, Ottawa (CA); Karen Denise Hendrix, Santa Rosa, CA (US); Michael O'Leary, San Jose, CA (US); Hery Djie, San Jose, CA (US); Lu Tian, Palo Alto, CA (US); Paul Colbourne, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 628 days.

This patent is subject to a terminal disclaimer.

(21) Appl. No.: 16/594,138

(22) Filed: Oct. 7, 2019

(65) Prior Publication Data

US 2020/0033509 A1     Jan. 30, 2020

Related U.S. Application Data

(63) Continuation of application No. 15/973,109, filed on May 7, 2018, now Pat. No. 10,436,947, which is a continuation of application No. 15/495,265, filed on Apr. 24, 2017, now Pat. No. 9,964,668, which is a continuation of application No. 14/798,764, filed on Jul. 14, 2015, now Pat. No. 9,632,225.

(51) Int. Cl.
    *G02B 5/18*        (2006.01)
    *G02B 5/30*        (2006.01)
           (Continued)

(52) U.S. Cl.
    CPC .............. *G02B 5/1871* (2013.01); *G02B 1/11* (2013.01); *G02B 1/12* (2013.01); *G02B 5/1809* (2013.01);
           (Continued)

(58) Field of Classification Search
    CPC ..... G02B 1/12; G02B 1/11; G02B 1/111–118; G02B 1/10; G02B 5/1809; G02B 5/3083;
           (Continued)

(56) References Cited

U.S. PATENT DOCUMENTS 7,397,980 B2    7/2008   Frisken et al.
7,787,720 B2    8/2010   Frisken et al.
           (Continued)

OTHER PUBLICATIONS

"Design, fabrication, and characterization of form-birefringent multilayer polarizing beam splitter", Tyan et al., Optical Society of America, vol. 14, No. 7, Jul. 1997, pp. 1627-1636 (Year: 1997).*

(Continued)

*Primary Examiner* — Stephone B Allen
*Assistant Examiner* — Adam W Booher
(74) *Attorney, Agent, or Firm* — Harrity & Harrity, LLP

(57) ABSTRACT

A zoned waveplate has a series of transversely stacked birefringent zones alternating with non-birefringent zones. The birefringent and non-birefringent zones are integrally formed upon an AR-coated face of a single substrate by patterning the AR coated face of the substrate with zero-order sub-wavelength form-birefringent gratings configured to have a target retardance. The layer structure of the AR coating is designed to provide the target birefringence in the patterned zones and the reflection suppression.

18 Claims, 14 Drawing Sheets

(51) Int. Cl.
*G02B 1/11* (2015.01)
*G02B 1/12* (2006.01)
*G03F 7/00* (2006.01)
*G02B 27/28* (2006.01)

(52) U.S. Cl.
CPC ......... *G02B 5/1819* (2013.01); *G02B 5/1833* (2013.01); *G02B 5/1857* (2013.01); *G02B 5/3083* (2013.01); *G02B 27/286* (2013.01); *G03F 7/0005* (2013.01)

(58) Field of Classification Search
CPC ...... G02B 5/18; G02B 5/1814; G02B 5/1819; G02B 5/1833; G02B 5/1857; G02B 5/1866; G02B 5/1871; G02B 27/286; G02B 27/28; G02B 2005/1804; G03F 7/0005; G03F 7/001
See application file for complete search history.

(56) References Cited

U.S. PATENT DOCUMENTS

| | | | |
|---|---|---|---|
| 8,164,721 B2 * | 4/2012 | Tan | G02F 1/133634 349/119 |
| 9,632,225 B2 | 4/2017 | Miller et al. | |
| 9,964,668 B2 | 5/2018 | Miller et al. | |
| 10,436,947 B2 | 10/2019 | Miller et al. | |
| 2004/0184019 A1 | 9/2004 | Totzeck et al. | |
| 2005/0275944 A1 | 12/2005 | Wang et al. | |
| 2006/0127829 A1 | 6/2006 | Deng et al. | |
| 2006/0127830 A1 | 6/2006 | Deng et al. | |
| 2007/0070276 A1 | 3/2007 | Tan et al. | |
| 2008/0192184 A1 * | 8/2008 | Tan | H04N 9/3167 348/E9.027 |
| 2009/0196152 A1 * | 8/2009 | Saito | G11B 7/1275 |
| 2013/0170034 A1 | 7/2013 | Merrill et al. | |
| 2014/0022616 A1 | 1/2014 | Popovich et al. | |
| 2014/0285878 A1 | 9/2014 | Escuti et al. | |

OTHER PUBLICATIONS

"Precision Nano-optical Waveplates", Wang et al., in Conference on Lasers and Electro-Optics, Technical Digest (Optica Publishing Group, 2003), paper CWA11 (Year: 2003).*

"Nano-fabrication and characterization of silicon meta-surfaces provided with Pancharatnam-Berry effect", Capaldo et al., Optical Materials Express, vol. 9, Issue 3, Mar. 1, 2019, pp. 1015-1032 (Year: 2019).*

"Free-Space Nano-Optical Devices and Integration: Design, Fabrication, and Manufacturing", Wang et al., Bell Labs Technical Journal 10(3), pp. 107-127, 2005 (Year: 2005).*

* cited by examiner

ZONED OPTICAL WAVEPLATE

RELATED APPLICATIONS

This application is a continuation of U.S. patent application Ser. No. 15/973,109, filed May 7, 2018 (now U.S. Pat. No. 10,436,947), which is a continuation of U.S. patent application Ser. No. 15/495,265, filed Apr. 24, 2017 (now U.S. Pat. No. 9,964,668), which is a continuation of U.S. patent application Ser. No. 14/798,764, filed Jul. 14, 2015 (now U.S. Pat. No. 9,632,225), the disclosures of which are incorporated herein by reference.

TECHNICAL FIELD

The present invention generally relates to optical polarization converting devices, and more particularly relates to a zoned optical waveplate for changing polarization of a stack of optical beams.

BACKGROUND

Optical waveplates are commonly used where light is manipulated in dependence on its state of polarization, such as in liquid crystals (LC) based optical switching and displays. An optical waveplate, which is also known as an optical retarder, is a device that alters the polarization state of a light beam. Common examples of optical waveplates include a half-wave plate that can be used to convert between two orthogonal linear polarizations of light, and a quarter wave plate that can be used to convert between linear and circular polarizations. A typical waveplate may be in the form of a slab of birefringent (BF) material, such as quartz, which has different refraction indices for different polarizations of incident light, and which thickness and orientation is selected to provide a desired retardance, i.e. a desired phase delay between light of orthogonal polarizations at the output of the waveplate.

One application of waveplates is to provide polarization diversity in LC-based light-manipulating devices, where input light of a mixed polarization is first converted into a desired state of polarization, which can then be predictably manipulated using an LC element. The polarization diversity may be accomplished, for example, by first splitting the input light into two orthogonally polarized beams, and then passing one of the two beams through a half-wave plate to equalize its polarization state with that of the second beam. One type of optical switches, such as for example wavelength selective switches (WSS) that are useful as wavelength selective add-drop switches in reconfigurable optical networks, may be configured to operate on a plurality of light beams in parallel. In such multi-port WSSs, input optical beams may be conveniently arranged in a beam stack wherein input and/or output beams are closely aligned next to each other along a direction termed 'vertical'; the polarization diversity in such switches may require an array of waveplates. Examples of such WSS are described in U.S. Pat. Nos. 7,397,980 and 7,787,720, both of which are incorporated herein by reference.

For example, FIG. 1, illustrates a portion of the front end arrangement of a WSS with vertical beam stacking and polarization diversity. In this arrangement collimated light beams from vertically aligned fiber ports (not shown) are each split into vertically and horizontally polarized sub-beams by a polarization walk-off element (not shown), so as to form a vertical stack input beams 11 of alternating vertical ('V') and horizontal ('H') polarization. A composite waveplate (WP) 120, which includes alternating regions 121, 122 of birefringent (BF) and non-birefringent (non-BF) material alternating in a vertically stacked configuration corresponding to the arrangement of the input beams 11, may then be used to selectively convert the polarization of vertically-polarized input beams to the horizontal polarization while leaving the horizontally polarized beams unchanged in polarization. Those of the input beams 11 that are horizontally polarized pass through the non-BF plates 122 of the WP 120 without changing its polarization state, while those that are vertically polarized pass through the BF wave plates 121 of the WP 120 that changes their polarization to horizontal, so that all of the output beams 12 after the WP 120 are horizontally polarized. By shifting the WP 120 by one plate width up or down, the polarization state of the output beams 12 may be changed to vertical. The output beams 12 may then be passed through a wavelength dispersive elements, and their constituent wavelengths individually processed using an LC array.

Thus, multi-port wavelength processors with polarization diversity may require a composite waveplate with alternating birefringent 221 and non-birefringent regions 222. Referring to FIG. 2, which reproduces FIG. 8 of U.S. Pat. No. 7,397,980, such composite waveplates may be constructed from bulk components in a process that includes first bonding together a stack of alternating sheets of birefringent and non-birefringent materials, such as quartz and glass. The front face 225 of the stack is then polished to an optical quality finish, and then cut transversely to the direction of the sheets along line 226. The cut piece may then be attached to a substrate and polished on the cut face to be the required thickness for a $\lambda/2$ waveplate at the wavelength of operation $\lambda$, after which the substrate may be removed. This process requires mechanical manipulations and precision machining, and is therefore relatively complicated and time consuming.

Accordingly, it may be understood that there may be significant problems and shortcomings associated with current solutions and technologies for providing composite waveplates with alternating birefringent and non-birefringent regions.

SUMMARY

Accordingly, the present disclosure relates to a zoned waveplate that has a series of transversely stacked birefringent zones alternating with non-birefringent zones or differently-patterned zones, with the birefringent and non-birefringent or differently-patterned zones integrally formed upon a same substrate by patterning one face thereof with zero-order sub-wavelength form-birefringent gratings configured to have a target retardance. The face of the substrate wherein the zones are formed may have AR coating that is designed to provide both the target birefringence in the patterned zones and the suppression of light reflection.

An aspect of the present disclosure provides a zoned optical waveplate (ZWP) comprising a substrate that is transparent to light of a target wavelength $\lambda$, and an anti-reflection (AR) coating disposed over the substrate and defining an AR coated face of the substrate, wherein the AR coated face of the substrate comprises a series of spaced apart patterned zones alternating with non-patterned zones or differently-patterned zones in a transverse direction, each patterned zone comprising a first zero-order form-birefringent sub-wavelength (ZOFBSW) relief grating that is configured to provide a target retardance for light of the target wavelength.

Another aspect of the present disclosure relates to a method of fabricating a zoned optical waveplate, which comprises: a) depositing an antireflection (AR) coating upon a substrate of optically transmissive material to form a wafer having an AR coated face, and b) defining on the AR coated face a series of patterned zones alternating with non-patterned zones or differently-patterned zones, wherein each patterned zone comprises a first zero-order form-birefringent sub-wavelength (ZOFBSW) surface-relief grating providing a target retardance for light of the target wavelength. The process of defining the series of patterned zones may include forming a two-level hard mask on the AR coated face of the wafer using hard mask lift-off, followed by anisotropic etching to define the ZOFBSW surface-relief grating in the AR coated face of the wafer.

An aspect of the present disclosure relates to a zoned optical waveplate comprising a substrate that is transparent to light of a target wavelength $\lambda$, and an anti-reflection (AR) coating disposed over the substrate and defining an AR coated face of the substrate, wherein the AR coated face of the substrate comprises a series of spaced apart patterned zones alternating with differently-patterned zones in a transverse direction, wherein each patterned zone comprising a first zero-order form-birefringent sub-wavelength (ZOFBSW) relief grating that is configured to provide a target retardance for light of the target wavelength, and wherein each differently patterned zone comprises a second zero-order form-birefringent sub-wavelength (ZOFBSW) relief grating that is defined by a plurality of parallel trenches and configured to provide a second target retardance for light of the target wavelength.

An aspect of the present disclosure relates to a zoned optical waveplate comprising a transparent substrate having an AR coated face comprising a series of first zero-order form-birefringent sub-wavelength (ZOFBSW) relief grating alternating with second zero-order form-birefringent sub-wavelength (ZOFBSW) relief gratings, wherein grating lines of the first and second ZOFBSW relief gratings are oriented at 45° to each other.

An aspect of the present disclosure relates to a zoned optical waveplate comprising a transparent substrate having an AR coated face comprising a series of first zero-order form-birefringent sub-wavelength (ZOFBSW) relief grating of a half-wave retardance at a target wavelength alternating with second zero-order form-birefringent sub-wavelength (ZOFBSW) relief gratings of a half-wave retardance at the target wavelength, wherein grating lines of the first and second ZOFBSW relief gratings are oriented at 45° to each other.

BRIEF DESCRIPTION OF THE DRAWINGS

Embodiments disclosed herein will be described in greater detail with reference to the accompanying drawings which represent exemplary embodiments thereof, in which like elements are indicated with like reference numerals, and wherein.

DETAILED DESCRIPTION

In the following description, for purposes of explanation and not limitation, specific details are set forth, such as particular optical components, optical materials, assemblies, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention. Note that as used herein, the terms "first", "second" and so forth are not intended to imply sequential ordering, but rather are intended to distinguish one element from another unless explicitly stated. Similarly, sequential labeling of method steps or operations do not imply sequential order of their execution. The terms 'transparent', 'transmissive', 'optically transparent', or 'optically transmissive' mean substantially transparent or transmissive for light at a target wavelength of operation λ. The term 'target wavelength' is understood to include a range of wavelengths. The term 'sub-wavelength', when used with a reference to a grating, means having a pitch or period that is smaller than the target wavelength of operation. The term 'grating' as used herein does not necessarily imply exact periodicity, and encompasses gratings wherein spacing of grating lines may vary across the grating; in such non-periodic or quasi-periodic gratings the term 'pitch' refers to an average distance between centers of the grating lines unless stated otherwise. While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
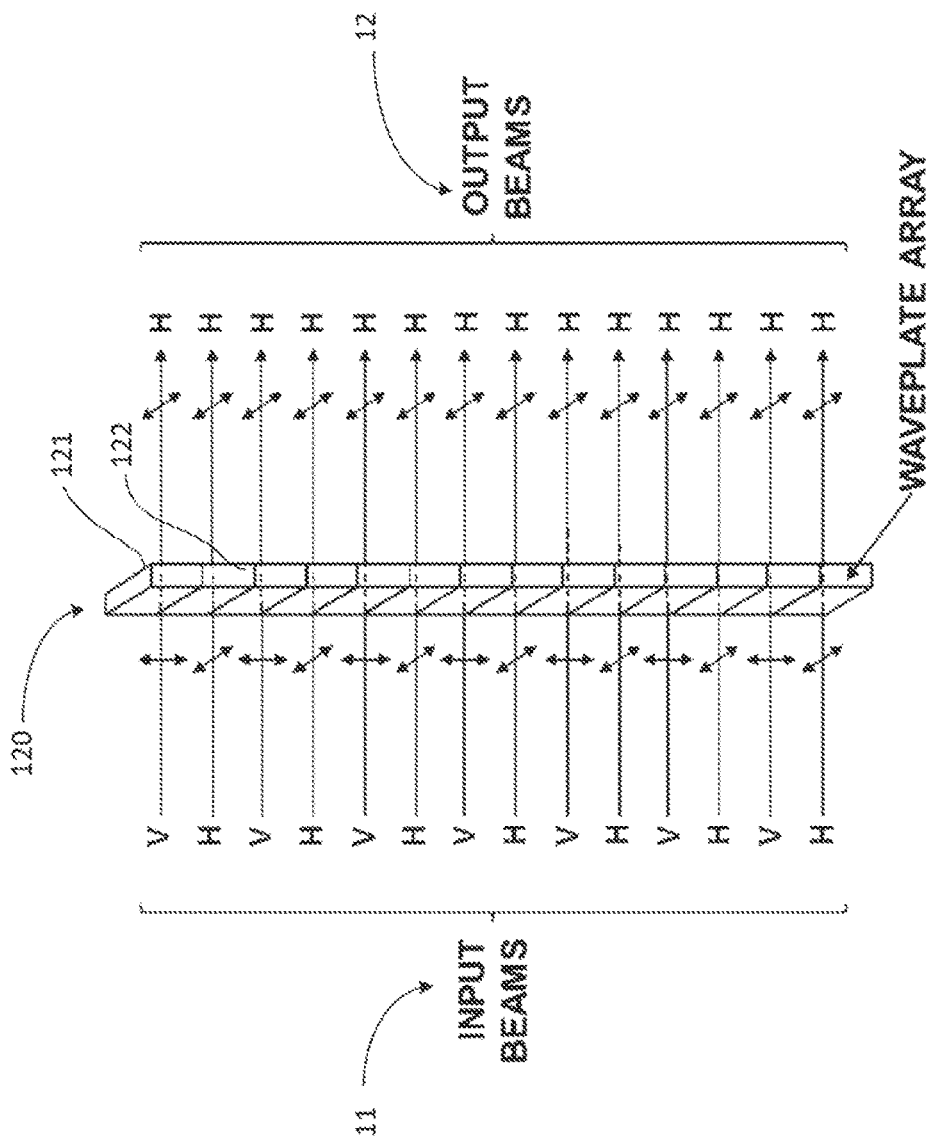
FIG. 1 is a schematic diagram of a portion of a polarization diversity arrangement of a multi-port optical switch with vertical port stacking using a composite waveplate array.
Figure 2:
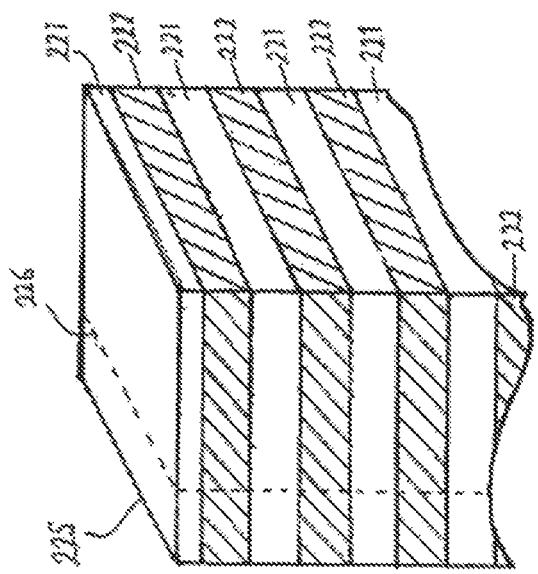
FIG. 2 is perspective view of a cutaway stack of alternating glass and quartz plates for constructing the composite waveplate array of FIG. 1.
Figure 4:
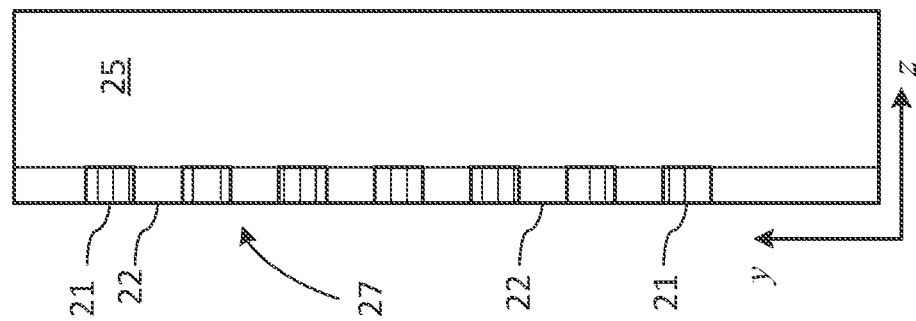
FIG. 4 is a side cross-sectional view of the ZWP of FIG. 3.
Figure 3:
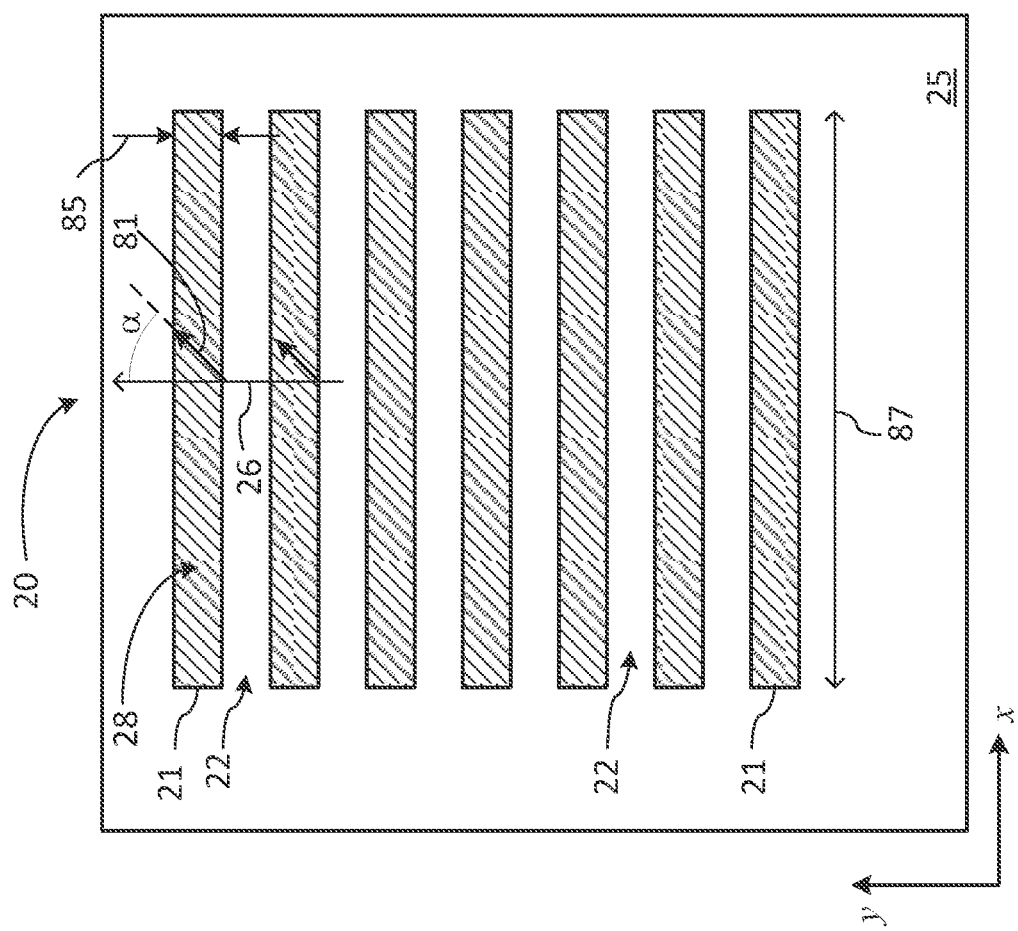
FIG. 3 is a plan view of a zoned waveplate (ZWP) with a series of spaced apart form-birefringent (FB) patterned zones.

FIGS. 3 and 4 illustrate, in plan and side views respectively, an exemplary zoned optical waveplate (ZWP) 20, which may be used in place of the composite waveplate 120 in the arrangement of FIG. 1 or the like. The ZWP 20 may be in the form of an optically transmissive substrate 25 having a series of spaced apart patterned regions or zones 21 defined at, or upon, a first face 27 thereof. The spaced apart patterned zones 21 are stacked in a selected direction 26 along the substrate 25. Although FIGS. 3 and 4 illustrate an exemplary embodiment with seven patterned zones 21, the zoned waveplate 20 may generally have any number $N_{pz}>1$ of the spaced apart patterned zones 21 greater than one, as needed for a particular application. By way of example, $N_{pz}$ may be in the range of 2 to 15 in a typical application. Spaces 22 between the patterned zones 21 on the first face 27 of the substrate 25 may be referred to as the non-patterned regions or zones 22 that alternate with the patterned zones 21. The direction 26 in which the zones 21, 22 are stacked upon the first substrate face 27 may be referred to herein as the transverse direction or the vertical direction; it is assumed to be the direction of the y-axis of a Cartesian coordinate system used in the present description, with the x-axis directed perpendicularly thereto in the plane of the substrate 25, and the z-axis directed into the substrate 25. The first face 27 of the substrate 26 may be coated with an anti-reflection (AR) coating, and may be referred to herein as the AR-coated substrate face 27. In each of the patterned zones 21, the AR-coated substrate face 27 is patterned to define a first zero-order form-birefringent (FB) sub-wavelength (ZOFBSW) grating 28 that is configured to provide a target retardance for light of the target wavelength at a desired angle of incidence. In the exemplary embodiments described hereinbelow, the target retardance is substantially the half-wave plate retardance, i.e. λ/2 if measured in units of wavelength or 180° if measured in units of phase delay, but may also be a different non-zero retardance in other embodiments, and may also vary from zone to zone. Grating lines of the first ZOFBSW grating 28, which may be referred to hereinafter as the FB grating 28 or simply as grating 28, may extend at an oblique angle α to the transverse direction 26 of the zone stack, defining a birefringence (BF) axis 81 of the patterned zone 21. In one preferred embodiment α=45°, in other embodiments a may take other values, including but not limited to 90°, 22.5° and 0°. In one embodiment, the FB grating 28 is a surface-relief grating wherein the grating lines in the patterned zones 21 are separated from each other by trenches or gaps formed in the AR coated substrate face 27, for example by etching, so that the grating lines project from the substrate 25. The trenches separating the grating lines of the grating 28 may be air-filled when the ZWP 20 is operated in air, and may be referred to herein as airgaps. The non-patterned zones 22, which are interspersed between patterned zones 21, are transversely homogeneous and have a negligible form birefringence at normal incidence. The patterned zones 21 may also be referred to herein as the BF zones 21, and the non-patterned zones 22-as the non-BF zones 22. In operation, light of the target wavelength or wavelengths impinges at the AR-coated substrate face 27 at a target angle of incidence experiences a zero or near-zero C-plane retardance when passing through the non-patterned zones 22, and experiences the desired target non-zero C-plane retardance when passing through the patterned zones 21. In the exemplary embodiments described herein, the target angle of incidence corresponds to normal or near-normal incidence relative to the substrate face 27.

The patterned zones 21 may be elongated in the direction perpendicular to the transverse direction 26 in which the zones 21, 22 are stacked, i.e. in the x-axis direction, which may be referred to herein as the longitudinal or horizontal direction; this is not required, but may be useful to simplify the horizontal alignment of the ZWP 20 in a target application or device. In the illustrated embodiment, the patterned and non-patterned waveplate zones 21, 22 are shaped as rectangular strips of approximately equal width 85, which may be defined by the size and spacing of the input beams 11 in a target application. This may be application-dependent and is not a necessary requirement, as embodiments wherein the zone width 85 and/or length 87 varies from zone to zone may be envisioned. By way of example only, the zone width 85 may be in the range of 100-1000 microns (μm), for example 150 μm, and the zone length 87 may be in the range of 500-5000 microns (μm), for example 1000 μm. In other embodiments, the patterned zones 21 may be of a non-rectangular shape, and/or have width and/or length outside of these ranges. The ZWP 20 may be viewed as a one-dimensional waveplate array with alternating BF and non-BF elements 21, 22, and may also be referred to herein as the waveplate array.

Figure 5:
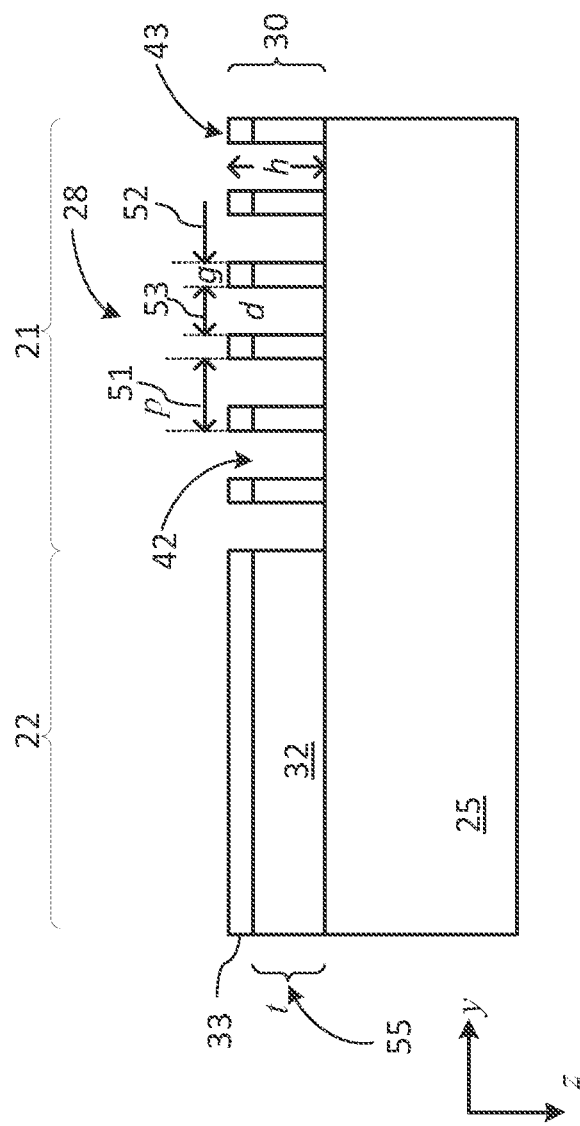
FIG. 5 is a schematic cross-sectional view of a two-zone portion of a ZWP with an FB grating formed in a multi-layer AR coating in the patterned zone of the ZWP.
Figure 6:
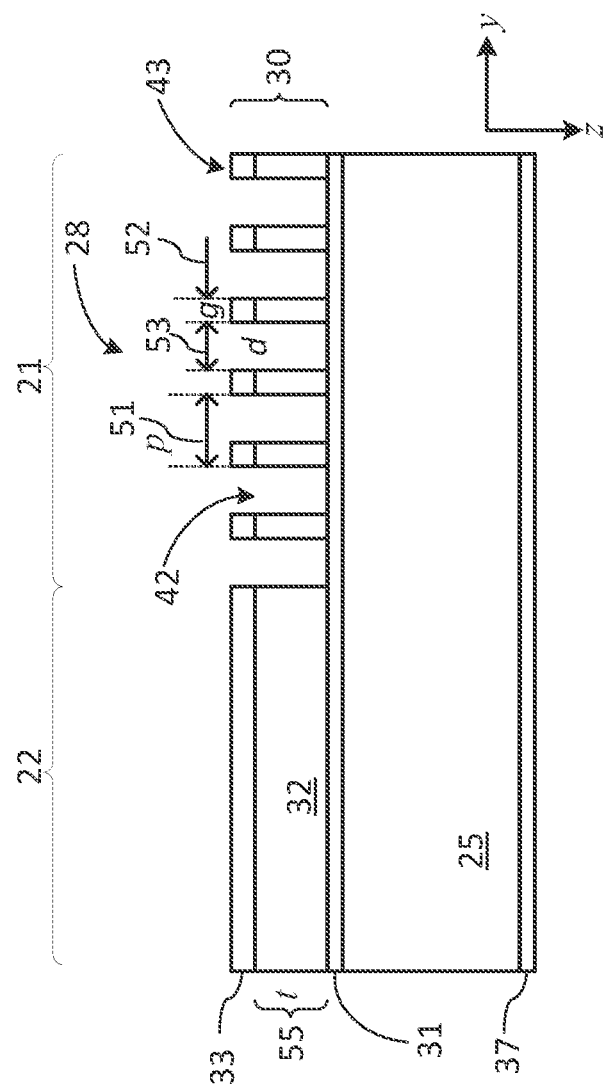
FIG. 6 is a schematic cross-sectional view of a two-zone portion of a ZWP having an etch-stop layer.

Turning now to FIGS. 5 and 6, there is shown a cross-sectional view of a portion of the ZWP 20 in one embodiment thereof. The cross-section is taken through adjacent portions of two waveplate zones, one patterned zone 21 and one non-patterned zone 22. The substrate 25 is coated with a multi-layer dielectric AR coating 30, which includes a spacer layer 32 of a first dielectric material of thickness t 55 that is deposited over the substrate 25, and an index matching layer 33 of a second dielectric material deposited over the spacer layer 32. Within the patterned zone 21, a plurality of parallel trenches or gaps 42 extending through the spacer layer 32 separate a plurality of parallel grating lines or ridges 43, with the spacer layer 32, ridges 43 and trenches 42 dimensioned so as to form the FB surface-relief grating 28 that provides the target retardance for light of the target wavelength λ at normal or near-normal incidence. The trenches 42 are spaced apart by the grating pitch 51 or period p=(d+g) that is smaller than the target wavelength λ; here d is the ridge width 52, and g is the gap width 53. In a preferred embodiment the multilayer coating 30 is configured to have anti-reflection (AR) properties in at least the non-patterned zone 22 that is substantially flat and absent of ridges and trenches, and may be referred to hereinafter as the AR coating 30. In embodiments wherein the trenches 42 are formed by etching, the multilayer coating 30 may include an etch stop layer 31 disposed between the substrate 25 and the spacer layer 32 as illustrated in FIG. 6, to provide etch depth accuracy and uniformity. The etch stop layer 31 may also provide additional index matching between the substrate 25 and the spacer 32 to enhance the AR feature of the ZWP 20 in the non-patterned zones 22. FIG. 6 also shows a second AR coating 37 that may be provided on the face of the substrate 25 that is opposite to the first face 27 of the substrate wherein the patterned zones 21 are located. In one preferred embodiment, the grating trenches 42 and lines or ridges 43 are substantially rectangular in cross-section. In other embodiments, the grating ridges 43 and trenches 42 may have cross-sections of a non-rectangular shape. By way of example, the parallel trenches 42 may occupy about 60% to 80% of the first FB surface-relief grating 28 in area, as defined by the ratio g/p, and depending on the materials of the AR coating and, possibly, of the substrate.

It is generally considered to be desirable for the grating pitch p of an FB grating to be as small as possible, but its reduction in practice may be limited by a feature resolution of the used fabrication technology. In one embodiment, the grating pitch p may be selected so as to ensure that, at normal or near-normal incidence, the first reflected and transmitted diffraction orders are evanescent, i.e. correspond to a diffraction angle of 90 degrees, or non-existent. This limitation yields the following condition on the maximum $p_{max}$ value of the pitch p, where $n_{sub}$ is the refraction index of the substrate 25:

$$p_{max} \leq \lambda_0 / n_{sub}. \tag{1}$$

Continuing to refer to FIGS. 5 and 6, the retardance of the FB grating 28 depends on the refractive indices of the spacer and index-matching layers of the AR coating 30 and the refractive index $n_{sub}$ of the substrate 25, on the height h of the grating lines 43, the grating pitch p, and the relative widths d, g of the grating lines 43 or the gaps 42. For a given set of materials and grating pitch p, a desired value of the grating retardance may be achieved by selecting the relative widths of the grating lines 43 and gaps 42, and the thickness and refractive indices of the layers 32, 33 forming the grating lines 43. When the optical thickness of the index-matching layer 33 is relatively small, the optical thickness $n_{sp} \cdot t$ of the spacer layer 32, where $n_{sp}$ is the refractive index of the spacer layer 32, exceeds the target retardance N of the ZWP in the patterned regions 21 measured in units of the wavelength.

By way of a first example, the substrate 25 of a ZWP 20 designed for operation at λ, ~1.55 µm may be made of fused silica (SiO2) and have a refractive index of about 1.45, the spacer layer 32 may be a layer of tantalum oxide, or tantala (Ta2O5), with a refraction coefficient of about 2.1, and the index matching layer 33 may be made of silica (SiO2), with the refraction coefficient of about 1.45. The etch stop layer 31, when present, may be a layer of aluminum oxide, or alumina (Al2O3), which index of refraction at 1.55 µm is about 1.65, or of a similar material that is less susceptible to etching than the material of the spacer layer 32 and, preferably, has an index of refraction than is between that of the substrate 25 and the spacer layer 32.

Figure 7A:
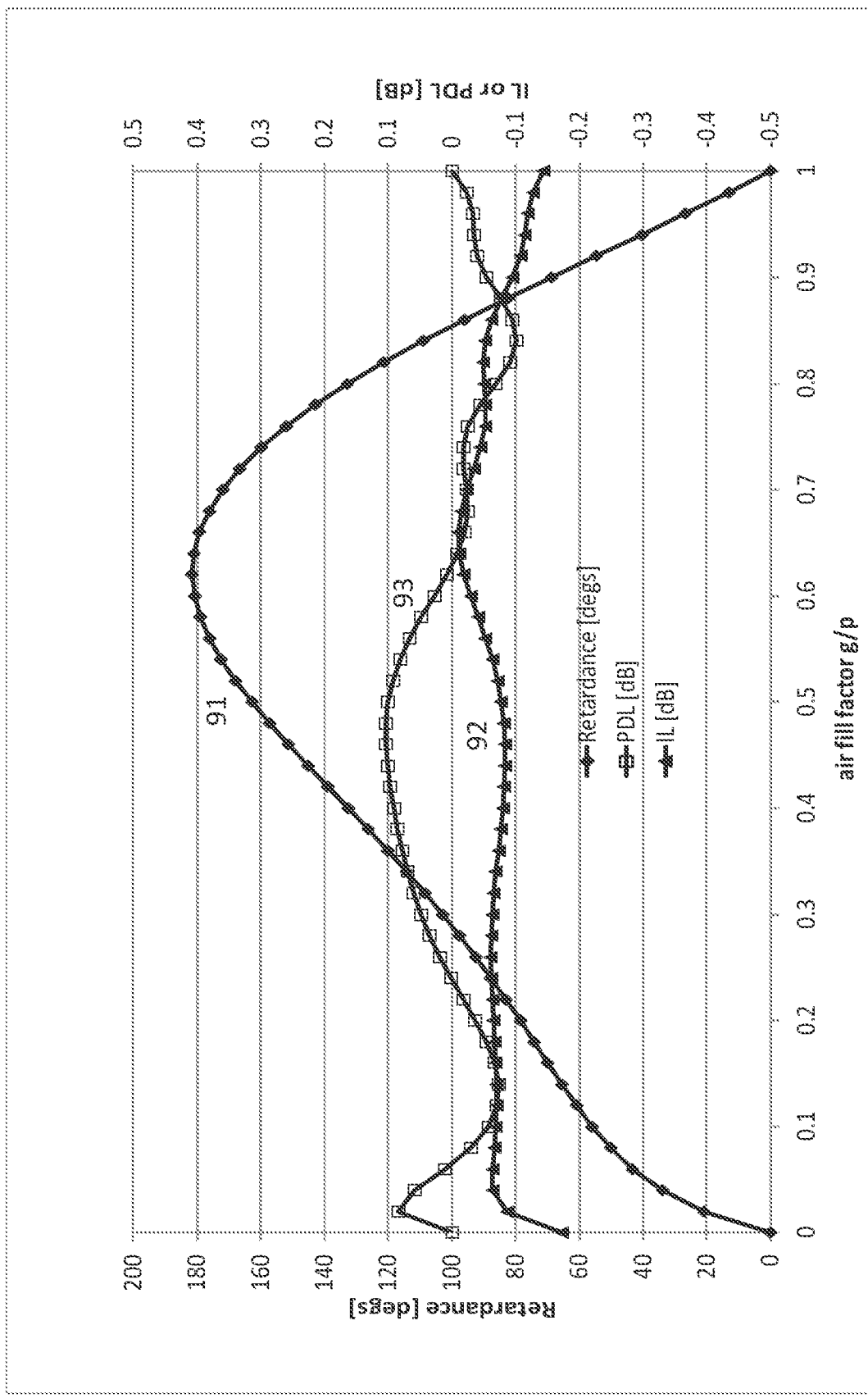
FIG. 7A is a graph illustrating retardance, polarization-averaged IL, and PDL in dependence on a grating fill factor for a grating-patterned zone of an embodiment of the ZWP of FIG. 5, with a fused silica substrate coated with a 2 μm tantala spacer layer and 0.3 μm silica index matching layer, and the FB grating pitch of 0.7 μm.
Figure 7B:
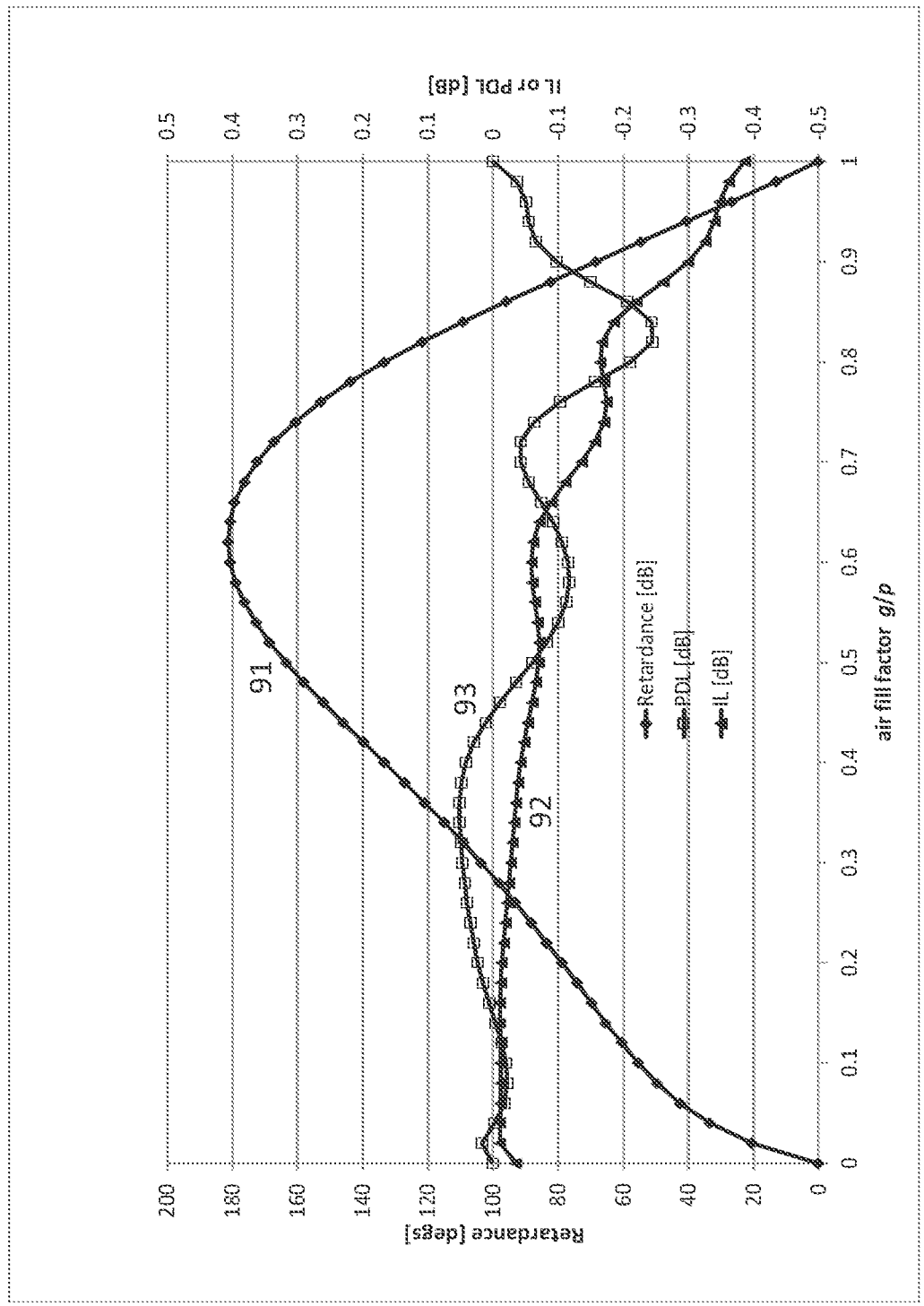
FIG. 7B is a graph illustrating retardance, polarization-averaged IL, and PDL in dependence on a grating fill factor for a grating-patterned zone of an embodiment of the ZWP of FIG. 6 with a fused silica substrate coated with a 0.3 μm alumina etch stop layer, a 2 μm tantala spacer layer, and 0.3 μm silica index matching layer, and the FB grating pitch of 0.7 μm.

FIGS. 7a and 7b illustrate exemplary simulations results for such FB gratings with and without a 0.3 µm thick alumina etch stop layer 31, respectively. The retardance 91, polarization-averaged insertion loss (IL) 92 and polarization-dependent loss (PDL) 93 at normal incidence for λ=1.55 µm are shown in dependence on the normalized width g/p of the grating trenches 42 for a FB grating 28 with a pitch p=0.7 µm, the tantala spacer layer 32 thickness t=2 µm, and the SiO2 index matching layer 33 thickness of ~0.3 µm. The normalized width g/p of the grating trenches 42 is also referred to herein as the grating air fill factor $f_{air}$=g/p, with $f_{air}$=0 corresponding to the non-patterned substrate face, and $f_{air}$=1 corresponding to the complete removal of the AR coating 30, up to the etch stop layer 31 where it exists. A convention in which the IL is represented in negative dB values is assumed. Regardless of the presence or absence of the etch stop layer 31, the half wave retardance, i.e. 180 degrees phase shift between the TE and TM polarization of the incident light, occurs in this example for the airgap width g≈0.65·p, or when the grating lines 43 occupy ~35% of the grating area. Both the IL and PDL are about or less than ~0.1 dB in absolute values for device parameters corresponding to 180 degrees of retardance. In the absence of the etch-stop layer 31, the IL for the non-patterned zone 2 (g/p=0 in FIGS. 7A and 7B) is however about −0.2 dB, which corresponds to about 96% transmittance, which is similar to the transmittance of an uncoated fused silica substrate. The addition of the alumina etch-stop layer 31 improves the IL of the un-patterned zones 22 by ~0.15 dB to about −0.03 dB, corresponding to an increase in transmittance from 96% to about 99.2%.

Figure 8:
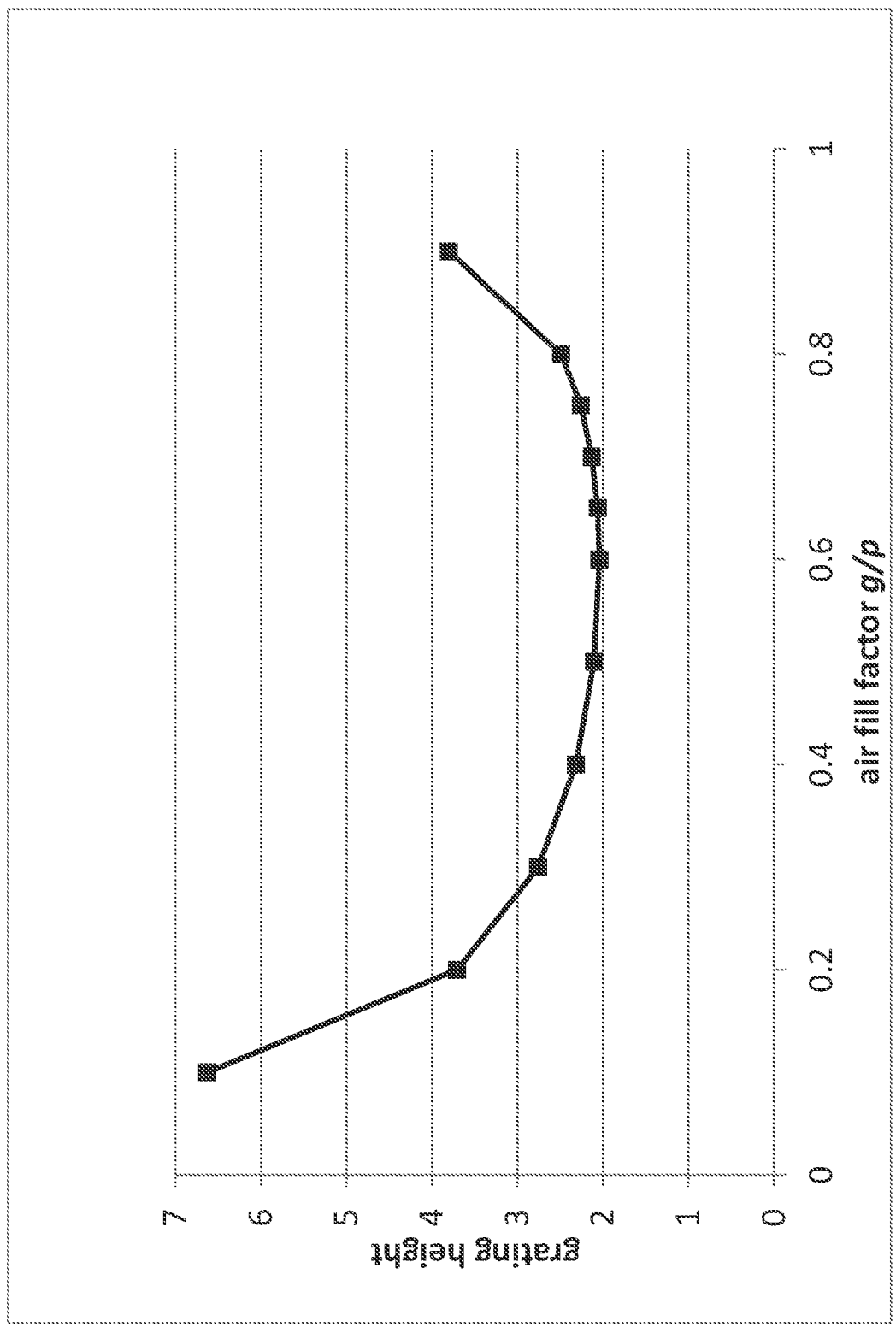
FIG. 8 is a plot of a grating line height that provides a half-wave plate retardance for the grating-patterned zones of the ZWP of FIG. 7A or 7B in dependence on the grating fill factor.

FIG. 8 shows exemplary simulation results for the grating line height h that provides a 180° retardance at normal incidence from the air in dependence on the normalized airgap width (air fill factor) $f_{air}$=g/p for an FB grating with the tantala grating lines upon the silica substrate; λ=1.55 µm, p=0.7 µm. It is seen that the target retardance of the FB grating 28 may be achieved with different layer thicknesses, for example by suitably varying the widths of the grating lines 43 and gaps 42. The FB grating with tantala grating lines 43 on a fused silica substrate 25 may have the half-wave retardance, for example, with the grating line height in the range of about 2 to 2.5 µm, and the air fill factor in the range of about 0.4 to 0.8. In the presence of the index-matching SiO2 layer 33, the thickness of the tantala spacer may be chosen for example in the range of 1.8 to 2.2 µm, and more preferably in the range of 1.9 to 2.1 µm, with the air fill factor in the range of about 0.55 to 0.75, and more preferably in the range of 0.6 to 0.7 for the chosen SiO2/Ta2O5/SiO2 or SiO2/AlOx/Ta2O5/SiO2 substrate/layer structure. The height h of the grating lines 42 or, equivalently, the depth of the trenches 42 scale approximately proportionally to the target retardance and the target wavelength of operation.

In the embodiment described hereinabove with reference to FIGS. 7A and 7B, the airgaps or trenches 42 have a relatively high aspect ratio h/g of about 4.4; such narrow and deep trances may be difficult to make using conventional dry etch techniques. The depth h of the trenches 42, and the airgap aspect ratio h/g, may however be reduced by using the spacer layer 32 of a material that has a greater index of refraction than tantala, such as, for example, crystalline silicon (Si), which refraction index $n_{si}$ at 1.55 um is about 3.5.

Figure 9:
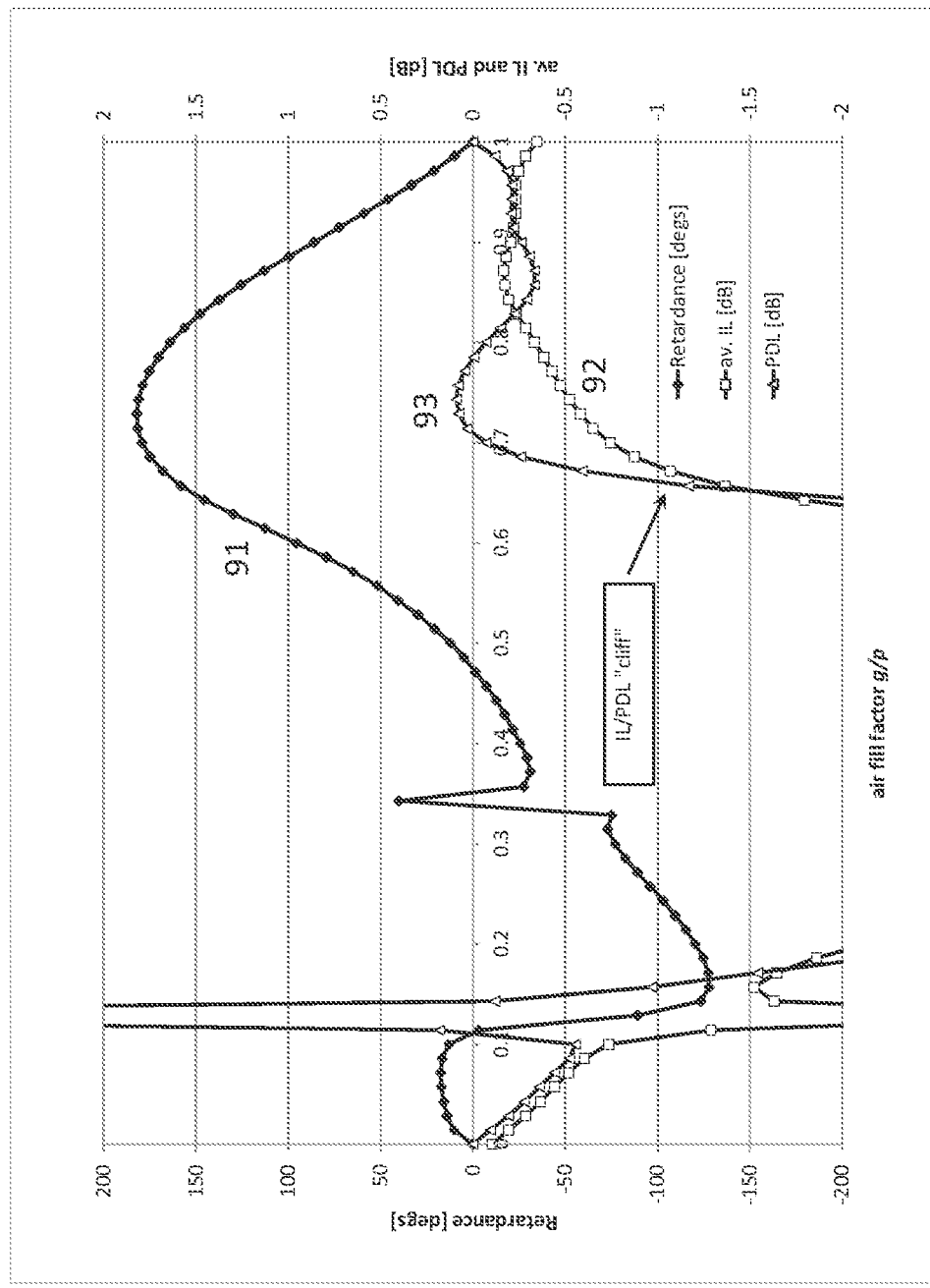
FIG. 9 is a graph illustrating retardance, polarization-averaged IL, and PDL in dependence on a grating fill factor for a grating-patterned zone of an embodiment of the ZWP of FIG. 6, with a fused silica substrate coated with a 0.17 μm alumina etch stop layer, 0.45 μm Silicon spacer layer, and 0.27 μm tantala index matching layer, and the FB grating pitch of 0.7 μm.

By way of a second example, the spacer layer 32 may be formed of silicon (Si) upon a fused silica substrate 25. The top index matching layer 33 may be made of tantala or another dielectric material of a similar refractive index, such as for example hafnium (IV) oxide (HfO2), also known as Hafnia, or silicon nitride (Si3N4). The etch stop layer 31, when present, may be again a layer of alumina (AlOx) or a similar material that is less susceptible to etching than the material of the spacer layer 32 and, preferably, has an index of refraction than is between refraction indices of the substrate 25 and the spacer layer 32. The form birefringence of the grating 28 with the grating lines formed of silicon may be increased, compared to those formed from tantala, by a factor of ~2.4, leading to a comparable reduction in the aspect ratio of the airgaps 42. FIG. 9 illustrates simulation results for the retardance 91, polarization-averaged IL 92 and PDL 93 in dependence on the normalized airgap width $f_{air}=g/p$ for such silicon-on-silica FB gratings 28 in the presence of a 0.17 µm thick alumina etch stop layer 31. Normal incidence at λ=1.55 µm are assumed; pitch p=0.7 µm, the Si spacer layer 32 thickness t~0.5 µm, and the tantala index matching layer 33 thickness of ~0.27 µm. The half-wave retardance between the TE and TM polarization of the incident light occurs in this example for the airgap width g≈0.75·p, or when the grating lines take ~25% of the grating area, with an IL of about 0.5 dB in absolute value. Accordingly, in this embodiment the airgap aspect ratio may be reduced to about 1.24, which is about 3.4 times smaller than the aspect ratio of the FB grating 28 with the spacer 32 made of tantala. The transmittance of the non-patterned zone 22, i.e. for $f_{air}=g/p=0$ in FIG. 9, is about 97.7%. The IL and PDL curves appear to exhibit a sharp cliff when the air gap width becomes less than about 0.7·p. It will be appreciated that the half-wave retardance of the FB grating 28, when desired, may be achieved with different layer thicknesses, for example by suitably varying the widths of the grating lines 43 and gaps 42. By way of example, the silicon spacer layer 32 may have a thickness t in the range of 0.4 to 0.55 µm, the index matching layer 33 made of tantala may have a thickness of ~0.2-0.4 µm, the etch-stop layer 31 may be made of alumina (AlOx) to a thickness of 0.1-0.3 µm. Further in this example, the FB grating 28 providing a half-waveplate retardance at the target wavelength of 1.55 µm may have the pitch p in the range of about 1 µm or less in the case of normal incidence, or about 0.5 µm-0.9 µm or less in the case a slightly off-normal incidence up to about 15 degrees off normal, with the air fill factor $f_{air}=g/p$ in the range of about 0.55 to 0.85.

Figure 10:
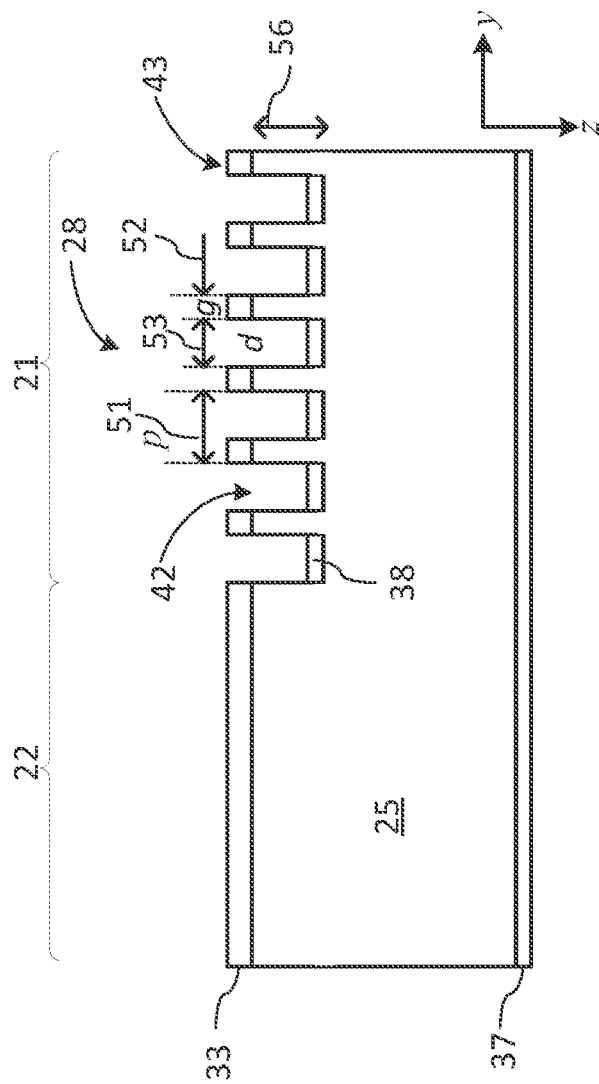
FIG. 10 is a schematic cross-sectional view of a two-zone portion of a ZWP with an FB grating extending through an AR coating into the substrate in the patterned zone of the ZWP.

Referring now to FIG. 10, the FB grating 28 may be formed in the absence of the spacer layer 32 by extending the gaps 42 into the substrate 25 to a depth 56 that is suitable for providing the target waveplate retardance, for example by a controlled anisotropic etching into the substrate. In such embodiments, the AR coating may be in the form of the index-matching layer 33 that has a refractive index that is smaller than the refractive index of the substrate 25. In one such embodiment the substrate 25 may be a silicon substrate, and the index matching layer may be made of tantala, hafnia, silicon nitride, or similar materials to provide index-matching of silicon to air. The half-waveplate retardance may be provided by the FB grating 28 with the airgap aspect ratio of about 1.3 or less, which is relatively easy to manufacture. Another index-matching layer 38 may also be provided over exposed portions of the silicon substrate 25 at the bottom of the trenches 42, to reduce the IL in the patterned zones 21. However, in accordance with equation (1), the use of the silicon substrate reduces the maximum value of the grating pitch $p_{max}$ to about 0.45 µm at the 1.55 µm wavelength and normal incidence, due to the relatively high value of the refractive index of the silicon substrate, $n_{sub}=n_{Si}$~3.5, as compared, for example, to fused silica which has a refractive index of about 1.45.

Figure 11:
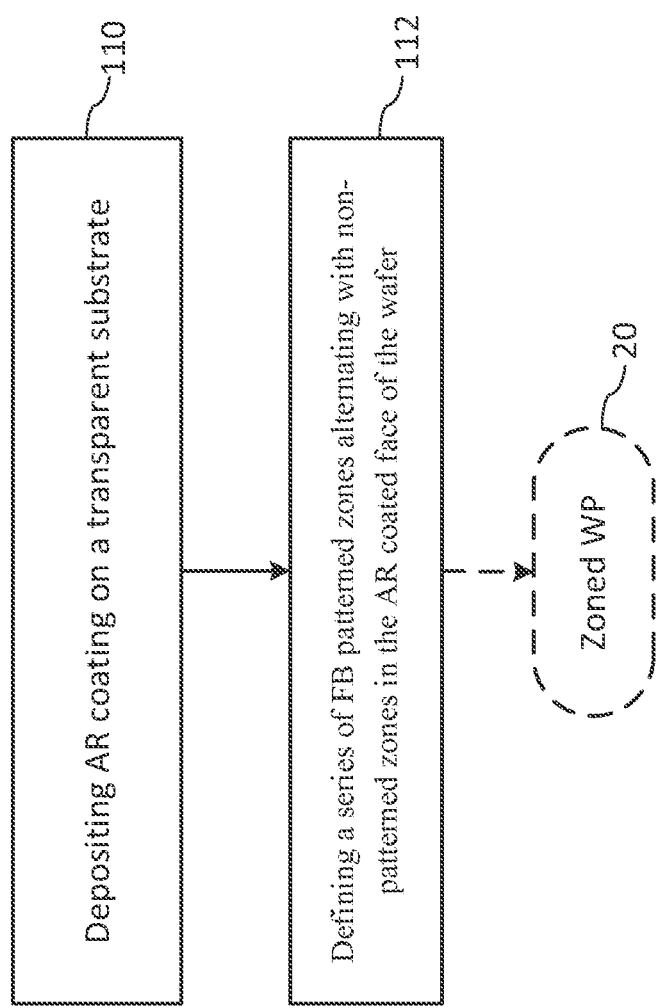
FIG. 11 is a flowchart generally illustrating steps of a method for fabricating a zoned waveplate.

Referring now to FIG. 11, ZWP 20 may be fabricated by first depositing an AR coating upon a substrate of optically transmissive material to form a wafer with an AR coated face at step 110, and then at step 112 defining at the AR coated face of the wafer a series of patterned zones alternating with non-patterned zones, wherein each patterned zone is patterned with a zero-order form-birefringent sub-wavelength surface-relief grating providing a target retardance for light of the target wavelength.

In one embodiment step 110 may include depositing the etch stop layer over the substrate, depositing the spacer layer over the etch stop layer, and then depositing the index matching layer over the spacer layer. In other embodiments, the etch stop layer or both the etch stop layer and the spacer layer may be omitted.

In one embodiment, step 112 may include forming a two-level hard mask to define the gaps and the grating lines in the sub-wavelength grating at a first level, and the patterned and non-patterned zones at second level. In one embodiment, a lift-off process may be used in the fabrication of the two-level mask.

Figure 12:
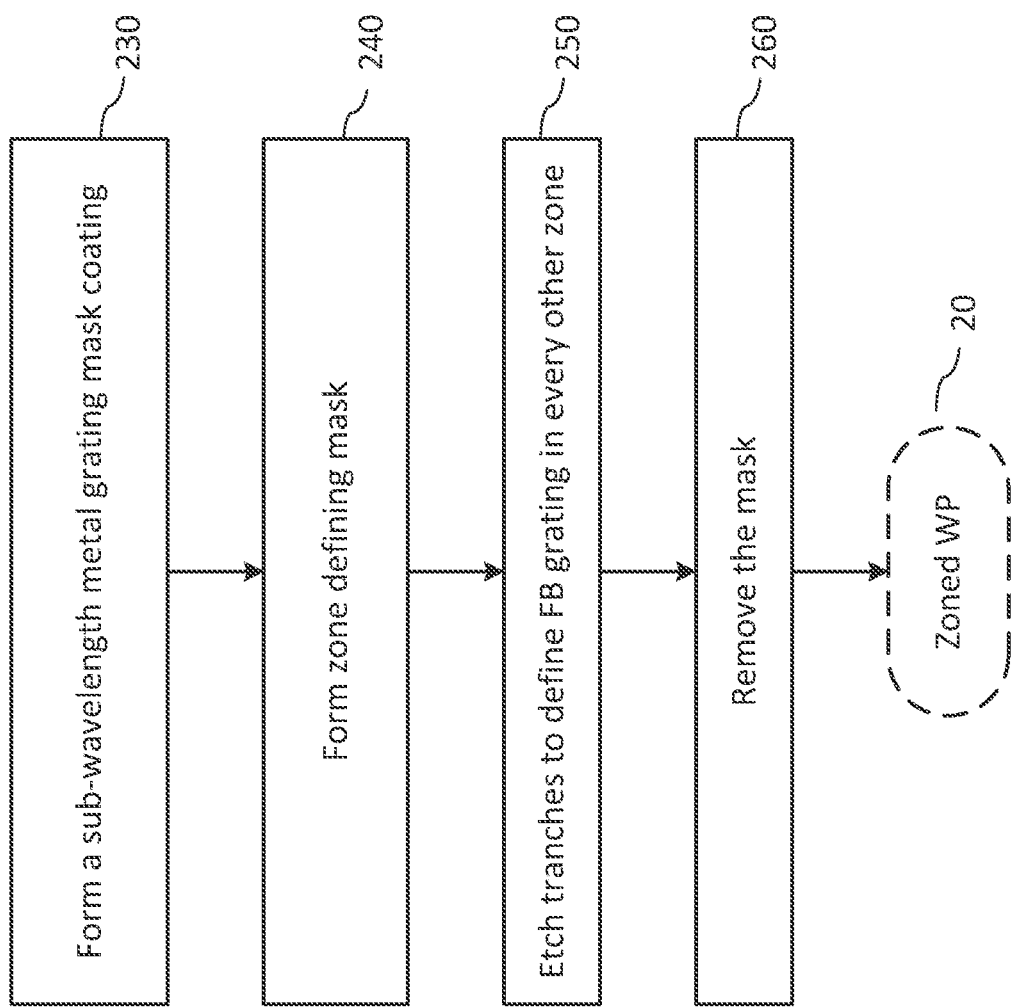
FIG. 12 is a flowchart of an embodiment of the method of FIG. 11 using a two-level mask.

With reference to FIG. 12, in one embodiment step 112 may include: forming a grating mask upon the AR coating formed of a plurality of parallel sub-wavelength strips defining a plurality of grating lines 43 of the FB relief grating 28 at step 230; at step 240 forming a zone mask over the grating mask, the zone mask having a plurality of zone openings defining the plurality of patterned zones 21; at step 250 subjecting the wafer to an anisotropic etch process so as to form the plurality of trenches within the patterned zones of the multilayer coating; and at step 260 removing the grating mask and the zone mask from the masked wafer to obtain the ZWP 20.

Figure 13:
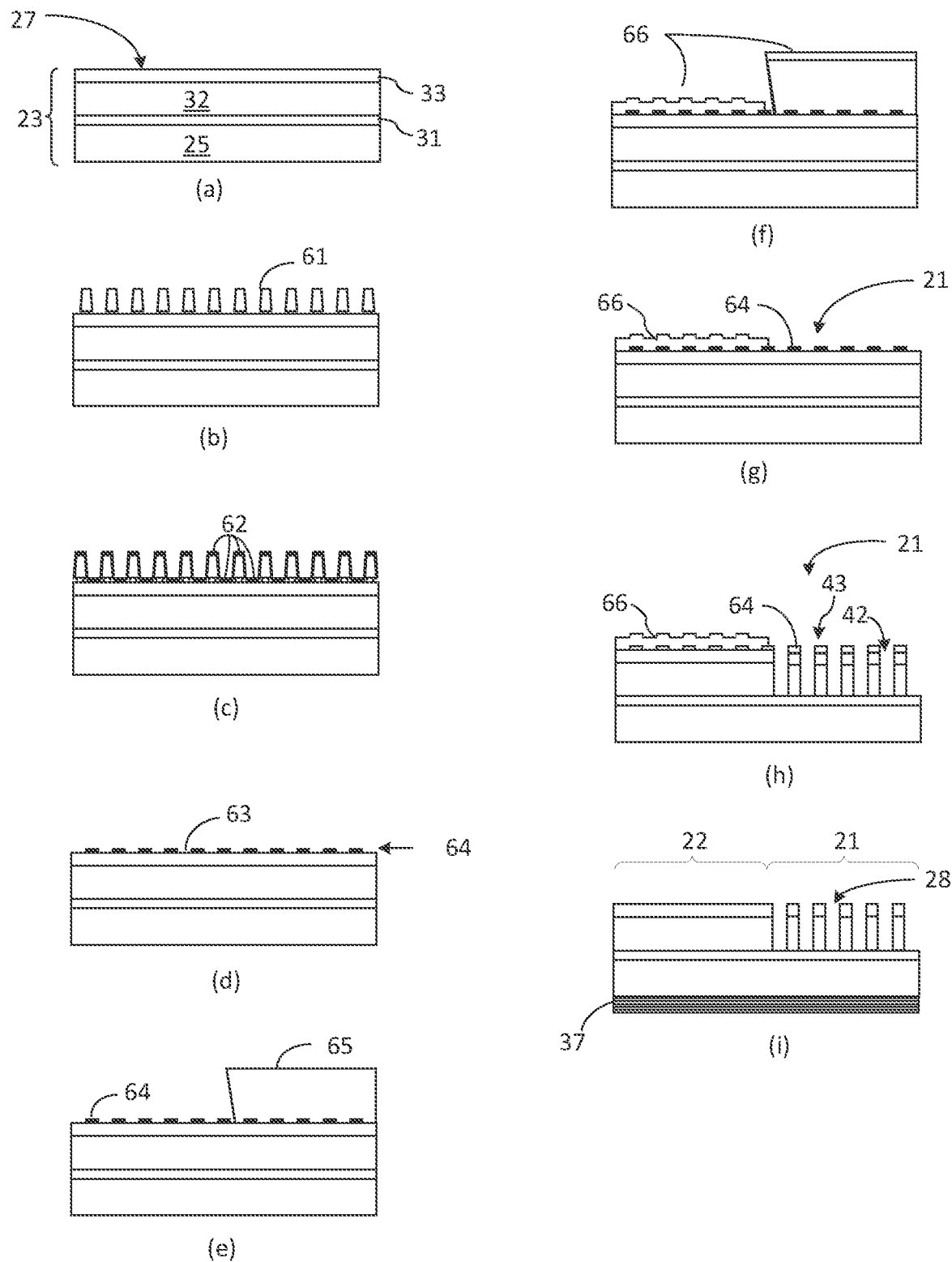
FIG. 13 is a schematic diagram illustrating the fabrication of a zoned waveplate at different stages of the fabrication process in one embodiment thereof.

Turning now to FIG. 13, sequential stages in the fabrication of an ZWP 20 are schematically illustrated in accordance with an exemplary embodiment of the method that is generally described hereinabove with reference to FIGS. 11 and 12. The process starts with an AR coated wafer 23 illustrated in panel (a) of the figure. Similarly to FIGS. 5, 6, and 10, FIG. 3 shows only a portion of the wafer with two adjacent zones, although the wafer may generally include two or more patterned zones, for example as illustrated in FIGS. 3 and 4. In the illustrated example the AR coating of the wafer is comprised of the etch stop layer 31, the spacer layer 32 and the index matching layer 33, although the process may also be applicable to AR coatings of differing compositions, for example those lacking either the etch stop layer 31, or lacking both the etch stop layer 31 and the spacer layer 32 as described hereinabove. Embodiments wherein the AR coatings includes more than three layers may also be envisioned within the confines of the present disclosure.

Continuing to refer to FIG. 13, a sub-wavelength grating mask 64 may then be formed upon the AR coated face 27 of the wafer 23 as illustrated in panel (d) of the figure, with gaps 63 in the mask defining the grating lines. The grating mask 64 is preferably a hardmask that may be made of metal, such as for example Chromium (Cr), so it would withstand subsequent etching. The process of grating mask fabrication may include the steps illustrated at panels (b) and (c), wherein the wafer is coated with a layer of a suitable photoresist (PR), which is then holographically patterned to obtain a 'soft' grating mask 61 as illustrated at (b), and then a layer 62 of the hardmask material is deposited over the soft grating mask 61 as illustrated at (c). The soft grating mask 61 may include a layer of bottom AR coating (BARC) between the photoresist and the AR coating of the wafer. The grating mask 64 may then be formed by a hardmask lift-off process, resulting in the wafer of panel (d) with the hard grating mask 64, which is composed of Cr lines 63 defining the grating trenches 42, formed at its AR coated face 27. Next, the wafer with the hard grating mask 64 is coated with a second PR layer and patterned to form a soft zone mask 65, with openings defining the non-patterned zones 22 as illustrated at panel (e). A second hardmask layer 66, for example of Cr, is then deposited over the wafer as illustrated at panel (f). A second hardmask lift-off process removes the second hardmask layer 66 from wafer regions wherein the patterned zones 21 are to be formed, leaving it over the regions of the AR-coated substrate face that are to remain non-patterned, such as the non-patterned zones 22 in-between the patterned zones 21; the resulting double-masked wafer is illustrated in panel (g). This wafer is then subject to an anisotropic etching process to form the FB surface-relief grating 28 in the patterned zones 21, leaving the double-masked regions 22 of the AR coated wafer face unpatterned. By way of example, the anisotropic etching process used to form the FB grating may be a suitable dry tech process, such as for example a reactive ion etching (RIE), inductively coupled plasma (ICP) etching, ion beam milling, or deep reactive ion etching. The hardmasks 66, 64 may then be removed, e.g. dissolved, as known in the art, resulting in the ZWP illustrated at panel (i). If desired, the second face of the substrate 25, which is absent of the FB patterning and is opposite to the first face 27, may be coated with a second AR coating 37 after the hard mask removal; alternatively, the second AR coating 37 may be applied earlier in the process, for example at the stage when the top AR coating 30 is formed.

Advantageously, the multilayer coating formed by these layers may be configured to act as an AR coating in non-patterned portions or zones of the ZWP 20 where it is not patterned with the FB gratings, and to act as a high transmittance waveplate of a desired retardance where it is patterned with the FB grating. The use of the same thin film coating to i) suppress reflections and ii) to provide desired birefringence when suitably patterned, allows for a streamlined fabrication of the ZWP 20 or similar multi-beam polarization-equalizing or polarization-converting components, in which no parts or layers of the thin film coating or the waveplate need to be added or removed after the BF gratings are formed. The fabrication process then becomes one of masking the AR coating regions and simply removing that mask once the BF grating is patterned into the coating.

Figure 14A:
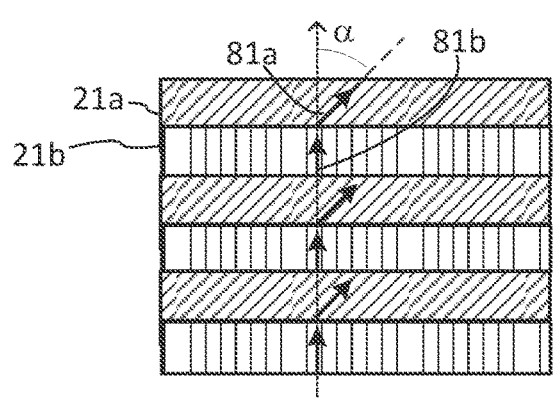
FIG. 14A is a schematic diagram of a zoned waveplate wherein FB gratings having grating lines oriented in a vertical direction alternate with FB gratings zones having grating lines oriented at 22.5° to the vertical direction.
Figure 14B:
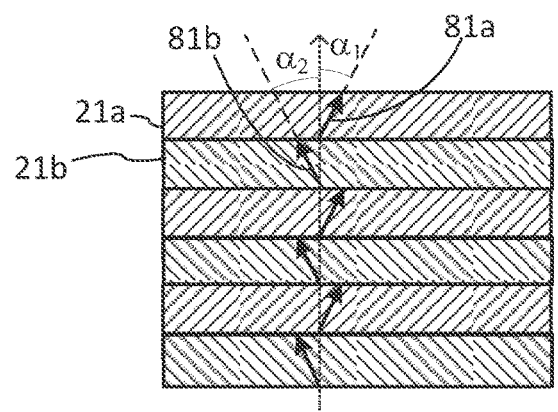
FIG. 14B is a schematic diagram of a zoned waveplate wherein FB gratings having grating lines oriented at 22.5° to a vertical direction alternate with FB gratings zones having grating lines oriented at −22.5° to the vertical direction.

In some embodiments of the zoned optical waveplate of the present disclosure the patterned zones 21 may alternate not with the non-patterned zones 22, but with differently patterned zones, wherein the differently patterned zones may each be patterned with a second ZOFB SW relief grating that is configured for providing a second target retardance at the target wavelength $\lambda$. The second target retardance of the second FB grating may differ from the first target retardance of the first FB relief grating 28, or be substantially equal thereto. The AR coated face of such a zoned optical waveplate is patterned, substantially, with a series of the first FB relief gratings alternating with second FB relief gratings, which differ from the first BF gratings. The second FB gratings may be configured to have a different retardance from the first FB gratings, or have a different orientation of the grating lines to act as a differently oriented waveplate, or both. In one exemplary embodiment, the first and second FB gratings may be configured to have the retardance of a half-wave plate, with the grating lines of the first and second FB relief gratings oriented at 45° to each other. Examples of such zoned optical waveplates are illustrated in FIGS. 14A and 14B, wherein portions of the AR coated faces are shown in a plan view. FIG. 14A illustrates a zoned optical waveplate wherein first ZOFB SW gratings, which define patterned zones 21*a* and which have grating lines, and hence the BF axis 81*a*, oriented at $\alpha=45°$ to the vertical direction, alternate with second ZOFBSW gratings, which define differently patterned zones 21*b* and which have grating lines, and hence the BF axis 81*b*, oriented along the vertical direction. FIG. 14B illustrates a zoned optical waveplate wherein the first ZOFBSW gratings of the patterned zones 21*a* have grating lines, and hence the BF axis 81*a*, oriented at $\alpha1=22.5°$ to the vertical direction, while second ZOFBSW gratings, which alternate with the first ZOFB SW gratings and define differently patterned zones 21*b*, have grating lines, and hence the BF axis 81*b*, oriented at $\alpha2=-22.5°$, to the vertical direction. Zoned waveplates of this configuration, wherein each of the first and second FB gratings of the patterned zones 21*a* and 21*b* have the retardance of a half wave-plate, may be useful in WSS applications and as an integrated circulator in a front end of a multi-beam wavelength processor.

The above-described exemplary embodiments are intended to be illustrative in all respects, rather than restrictive, of the present invention, and various modifications thereof and other embodiments will become apparent to those skilled in the art. For example, the AR coating 30 may include other layers and sub-layers in addition to those described hereinabove; for example the index-matching layer 33 may itself be multi-layer. Furthermore, although the concrete numerical examples described hereinabove relate to FB gratings having quarter-wave retardance at 1.55 µm, those skilled in the art will appreciate that zoned waveplates with other values of the target retardance in the patterned zones and/or other wavelength of operation may be designed using known in the art approaches. Furthermore, embodiments may be envisioned wherein the zoned waveplate 20 of the present disclosure operates while placed in an environment other than air; accordingly, the trenches 42, which are referred to hereinabove also as airgaps, may be filled with gases other than air, or may contain vacuum, and the term 'airgap' should be understood herein to encompass such trenches. Moreover, the retardance of the FB-patterned zones 21 may vary from zone to zone or within each FB-patterned zone 21.

Furthermore, a series of spaced apart patterned zones alternating with non-patterned or differently-patterned zones as descried herein can include a series of one patterned zone and one differently patterned zone. Furthermore, each of the exemplary embodiments described hereinabove may utilize features that were described herein with reference to other embodiments. Furthermore, although the exemplary embodiments described hereinabove were described in terms of vertical and horizontal configurations, the orientations can readily be substituted with other orientations within the scope of the present disclosure.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

We claim:

1. A device comprising:
    a substrate that is transparent to light of a target wavelength $\lambda$; and an anti-reflection (AR) structure disposed over the substrate, wherein
the AR structure comprises a sub-wavelength grating and creates a phase delay between a first polarization and a second polarization,
the sub-wavelength grating comprises a spacer layer of the AR structure formed over the substrate, and an index matching layer of the AR structure formed over the spacer layer, and
the spacer layer is formed from a single material.

2. The device of claim 1, wherein the device is a zoned optical waveplate.

3. The device of claim 1, wherein the first polarization is orthogonal to the second polarization.

4. The device of claim 1, wherein the AR structure includes a series of zones that is repeated on the AR structure one or more times.

5. The device of claim 4, wherein zones, of the series of zones, are arranged linearly.

6. The device of claim 4, wherein two zones, of the series of zones, comprise different sub-wavelength gratings.

7. An optical waveplate comprising:
a substrate that is transparent to light of a target wavelength $\lambda$; and
an anti-reflection (AR) structure disposed over the substrate, wherein
the AR structure comprises a sub-wavelength grating,
the sub-wavelength grating comprises a spacer layer of the AR structure formed over the substrate, and an index matching layer of the AR structure formed over the spacer layer, and
the spacer layer is formed from a single material.

8. The optical waveplate of claim 7, wherein the sub-wavelength grating is configured to provide a first target retardance for light of the target wavelength.

9. The optical waveplate of claim 7, wherein the optical waveplate is a zoned optical waveplate.

10. The optical waveplate of claim 7, wherein the sub-wavelength grating is a first zero-order form-birefringent sub-wavelength (ZOFBSW) relief grating.

11. The optical waveplate of claim 7, wherein the AR structure includes a series of zones that is repeated on the AR structure one or more times.

12. The optical waveplate of claim 11, wherein zones, of the series of zones, are arranged linearly.

13. The optical waveplate of claim 11, wherein two zones, of the series of zones, comprise different sub-wavelength gratings.

14. A method of fabricating an optical waveplate, the method comprising:
depositing an antireflection (AR) structure upon a substrate of optically transmissive material,
wherein the AR structure comprises a sub-wavelength grating and creates a phase delay between a first polarization and a second polarization,
wherein the sub-wavelength grating comprises a spacer layer of the AR structure formed over the substrate, and an index matching layer of the AR structure formed over the spacer layer, and
wherein the spacer layer is formed from a single material.

15. The method of claim 14, wherein the first polarization is orthogonal to the second polarization.

16. The method of claim 14, wherein the AR structure includes a series of zones that is repeated on the AR structure one or more times.

17. The method of claim 16, wherein two zones, of the series of zones, comprise different sub-wavelength gratings.

18. The method of claim 14, wherein depositing the AR structure includes:
depositing an etch-stop layer over the substrate;
depositing the spacer layer over the etch-stop layer; and
depositing the index matching layer over the spacer layer.

* * * * *